United States Patent
Wang

(10) Patent No.: US 12,228,168 B2
(45) Date of Patent: Feb. 18, 2025

(54) FASTENING MEMBER WITH FASTENING PORTIONS

(71) Applicant: FIVETECH TECHNOLOGY INC., New Taipei (TW)

(72) Inventor: Ting-Jui Wang, New Taipei (TW)

(73) Assignee: FIVETECH TECHNOLOGY INC., New Taipei (TW)

( * ) Notice: Subject to any disclaimer, the term of this patent is extended or adjusted under 35 U.S.C. 154(b) by 545 days.

(21) Appl. No.: 16/861,243

(22) Filed: Apr. 29, 2020

(65) Prior Publication Data
US 2020/0355209 A1    Nov. 12, 2020

(30) Foreign Application Priority Data

May 10, 2019   (TW) ................................ 108205868

(51) Int. Cl.
*F16B 5/06*   (2006.01)
*F16B 21/09*  (2006.01)
*H05K 1/14*   (2006.01)

(52) U.S. Cl.
CPC ............ *F16B 5/0621* (2013.01); *F16B 21/09* (2013.01); *H05K 1/14* (2013.01); *H05K 2201/2036* (2013.01)

(58) Field of Classification Search
CPC ...... F16B 5/0621; F16B 21/09; F16B 5/0258; F16B 5/0283; F16B 37/00; F16B 43/001; H05K 2201/2036; H05K 7/142
USPC .................................... 411/427; 16/2.1, 2.4
See application file for complete search history.

(56) References Cited

U.S. PATENT DOCUMENTS

| | | | |
|---|---|---|---|
| 3,219,157 A * | 11/1965 | Gordon ................. | A47B 57/50 403/108 |
| 3,223,374 A * | 12/1965 | Butler .................. | F16B 5/0258 267/141.4 |
| 3,996,500 A * | 12/1976 | Coules ................. | H05K 7/12 248/500 |
| 4,074,491 A * | 2/1978 | Bell ..................... | F16B 5/0258 411/116 |
| 4,358,098 A * | 11/1982 | Ceseri ................. | F16B 5/0258 267/141.5 |
| 4,827,609 A * | 5/1989 | Kawecki ............... | F16B 21/02 439/573 |
| 5,548,486 A * | 8/1996 | Kman .................. | H01R 12/523 439/82 |
| 6,179,631 B1* | 1/2001 | Downes .............. | H05K 3/3447 228/56.3 |

(Continued)

FOREIGN PATENT DOCUMENTS

CN        202937576 U    5/2013
CN        205213217 U    5/2016
(Continued)

*Primary Examiner* — Robert Sandy
*Assistant Examiner* — Rowland Do

(57) ABSTRACT

A fastening member with a plurality of fastening portions includes two or more fastening portions. The fastening portions are configured to be connected to a first object or to be connected to a second object, and have the same or different fastening connection directions or the same or different fastening connection positions. Thus, the fastening member may be disposed at a third object, and be connected to the first object and the second object by the fastening portions, respectively, so as to complete coupling and separation of at three objects, achieving the effect of repeated quick coupling and separation.

1 Claim, 14 Drawing Sheets

(56) References Cited

U.S. PATENT DOCUMENTS

| | | | | |
|---|---|---|---|---|
| 6,345,994 B1* | 2/2002 | Johnson | H05K 7/142 | 439/95 |
| 6,773,269 B1* | 8/2004 | Downes | H05K 3/368 | 439/55 |
| 6,818,839 B2* | 11/2004 | Hosaka | H01R 12/57 | 174/262 |
| 7,223,106 B2* | 5/2007 | Nakajima | H01R 13/6215 | 411/389 |
| 7,303,366 B2* | 12/2007 | Smith | F16B 19/1054 | 411/501 |
| 9,038,876 B2* | 5/2015 | Aleem | B60R 9/06 | 224/555 |
| 9,151,352 B2* | 10/2015 | Mayr | F16F 1/3732 | |
| 9,525,380 B2* | 12/2016 | Kim | F24S 25/632 | |
| 2010/0126829 A1* | 5/2010 | Nicolet | B65G 49/064 | 198/803.2 |
| 2011/0167628 A1* | 7/2011 | Goertz | G06F 3/0428 | 29/840 |
| 2013/0044449 A1* | 2/2013 | Chiu | H05K 7/142 | 361/767 |
| 2014/0075882 A1* | 3/2014 | Porter | E04F 13/0816 | 52/745.09 |
| 2014/0137927 A1* | 5/2014 | Kim | H02S 30/10 | 136/251 |
| 2016/0108945 A1* | 4/2016 | Yang | F16B 21/09 | 403/359.6 |
| 2016/0374202 A1* | 12/2016 | Wang | H05K 1/144 | |
| 2017/0343036 A1* | 11/2017 | Chu | F16B 21/09 | |
| 2019/0364673 A1* | 11/2019 | Hayashi | H05K 1/02 | |

FOREIGN PATENT DOCUMENTS

| | | |
|---|---|---|
| CN | 106438608 A | 2/2017 |
| CN | 106931010 A | 7/2017 |

* cited by examiner

FASTENING MEMBER WITH FASTENING PORTIONS

CROSS-REFERENCE TO RELATED APPLICATION

This non-provisional application claims priority under 35 U.S.C. § 119 (a) on Patent Application No(s). 108205868 filed in Taiwan, R.O.C. on May 10, 2019, the entire contents of which are hereby incorporated by reference.

BACKGROUND OF THE INVENTION

1. Field of the Invention

The present invention relates to a fastening member with a plurality of fastening portions, and more particularly to a fastening member with a plurality of fastening portions that is capable of completing coupling or separation of at least three objects and thus achieving repeated quick coupling and separation.

2. Description of the Related Art

To couple at least two or three objects, lock connection is usually performed using a screw so as to couple the objects.

However, although being capable of coupling at least two objects or three objects into a form that is not easily separated, the conventional fixing means above can result in a complicated assembly process and also a complicated disassembly process of at least one object due to the fixed connection of the screw.

Therefore, the present invention aims to disclose an invention of a fastening member with a plurality of fastening portions, so as to complete coupling or separation of at least three objects and achieve the effect of repeated quick coupling and separation.

BRIEF SUMMARY OF THE INVENTION

In view of the issues and drawbacks of the prior art, the inventor has dedicated to research and development of a fastening member with a plurality of fastening portions, so as to complete coupling or separation of at least three objects and achieve the object of repeated quick coupling and separation.

To achieve the above and other objects, the present invention provides a fastening member with a plurality of fastening portions. The fastening member includes two or more fastening portions. The fastening portions are configured to be connected to a first object or be connected to a second object, and have the same or different fastening connection directions or the same or different fastening connection positions.

The foregoing fastening member with a plurality of fastening portions includes one or more assembly portions configured to be assembled to a third object or a fourth object.

In the foregoing fastening member with a plurality of fastening portions, the fastening portions or the assembly portions are configured to be assembled to the third object or the fourth object by rivet connection, fastening connection, welding connection, expansion connection, lock connection, sleeve connection or fastening connection by another fastening member.

In the foregoing fastening member with a plurality of fastening portions, each fastening portion or the assembly portion has a material storage space, and is configured to be pressed by an external force on the fastening member that then presses the third object or the fourth object such that the material of the third object or the fourth object enters the material storage space of the assembly portion, and to be assembled with the third object or the fourth object.

In the foregoing fastening member with a plurality of fastening portions, the fastening portions or the assembly portion is configured to be pressed by an external force, to be deformed and engaged with the third object or the fourth object, and to be assembled with the third object or the fourth object.

In the foregoing fastening member with a plurality of fastening portions, each fastening portion or the assembly portion is a protrusion, a recess, a plane portion, a curved surface portion, an arc surface portion, a stepped surface portion or an inclined surface portion.

The foregoing fastening member with a plurality of fastening portions is taken out from a carrier by a tool and placed in the first object, the second object, the third object or the fourth object for assembly or fastening connection.

The foregoing fastening member with a plurality of fastening portions is taken out from a carrier by a tool, and is compared with the position of the first object, the second object, the third object or the fourth object by a comparison device and placed for assembly or fastening connection.

The foregoing fastening member with a plurality of fastening portions has a welding surface configured to be weld connected to the first object, the second object, the third object or the fourth object.

In the foregoing fastening member with a plurality of fastening portions, the first object, the second object, the third object or the fourth object is a printed circuit board (PCB).

In the foregoing fastening member with a plurality of fastening portions, the fastening member, the first object, the second object, the third object or the fourth object has a welding surface, wherein the material of the welding surface is tin, copper, nickel or zinc, or a related weldable material.

In the foregoing fastening member with a plurality of fastening portions, each of the fastening portions is a thread portion, an outer thread portion, an inner thread portion, a slot, a recess, a hole, a protrusion, a column, a fastener, an I-shaped body, a plate body or a hook body.

In the foregoing fastening member with a plurality of fastening portions, each of the fastening portions includes a head and a neck.

In the foregoing fastening member with a plurality of fastening portions, the head enters a receiving fastening portion of the first object or the second object, and the neck is receivingly fastened in a fastening connection portion of the first object or the second object.

In the foregoing fastening member with a plurality of fastening portions, the width of the receiving fastening portion is more than that of the head, and the width of the fastening connection portion is less than that of the head and more than that of the neck.

In the foregoing fastening member with a plurality of fastening portions, the fastening connection directions of the fastening portions are respectively on different horizontal positions in the same horizontal direction.

In the foregoing fastening member with a plurality of fastening portions, the fastening connection directions of the fastening portions are respectively on the same horizontal position in the same horizontal direction.

In the foregoing fastening member with a plurality of fastening portions, the fastening connection directions of the fastening portions are respectively on different horizontal positions in the same vertical direction.

In the foregoing fastening member with a plurality of fastening portions, the fastening connection directions of the fastening portions are respectively on the same horizontal position in the same vertical direction.

In the foregoing fastening member with a plurality of fastening portions, the fastening connection directions of the fastening portions are respectively on opposite horizontal positions or vertical positions.

In the foregoing fastening member with a plurality of fastening portions, the fastening portions are respectively on positions of different vertical heights.

In the foregoing fastening member with a plurality of fastening portions, the fastening portions are respectively on positions of different vertical heights and different horizontal positions.

In the foregoing fastening member with a plurality of fastening portions, the fastening portions are respectively connected to the first object or the second object by fasteners.

In the foregoing fastening member with a plurality of fastening portions, the fastening portions are respectively on the same or different horizontal positions.

In the foregoing fastening member with a plurality of fastening portions, the fastening portions are respectively on the same or different vertical positions.

In the foregoing fastening member with a plurality of fastening portions, each fastening portion has a material storage space, and is configured to be pressed by an external force on the fastening member that then presses the first object or the second object such that the material of the first object or the second object enters the material storage space, and to be assembled with the first object and the second object.

In the foregoing fastening member with a plurality of fastening portions, the fastening portions are configured to be pressed by an external force, to be deformed and engaged with the first object or the second object, and to be assembled with the first object or the second object.

In the foregoing fastening member with a plurality of fastening portions, the first object or the second object may be connected in a manner of different heights, different vertical directions, different horizontal directions, the same height, the same vertical direction or the same horizontal direction by the fastener.

In the foregoing fastening member with a plurality of fastening portions, the first object, the second object, the third object or the fourth object may be connected in a manner of different heights, different vertical directions, different horizontal directions, the same height, the same vertical direction or the same horizontal direction by the fastener.

In the foregoing fastening member with a plurality of fastening portions, the first object, the second object, the third object or the fourth object may be fixed, rotated, turned, floatingly displaced, vertically floatingly displaced, horizontally floatingly displaced, height floatingly displaced or limited fixing connected using the fastener as a fulcrum.

The foregoing fastening member with a plurality of fastening portions is formed by turning, forging, injection molding, stamping, rolling, or in-film injection.

The foregoing fastening member with a plurality of fastening portions is in a metal material, a non-metal material or a plastic material.

The foregoing fastening member with a plurality of fastening portions may be placed on a carrier.

In the foregoing fastening member with a plurality of fastening portions, the carrier may include a cover.

In the foregoing fastening member with a plurality of fastening portions, the assembly portion is on a middle position, an upper position, a lower position, positions on two sides, a vertical position or a horizontal position of two fastening portions.

In the foregoing fastening member with a plurality of fastening portions, the assembly portion is located between two fastening portions.

In the foregoing fastening member with a plurality of fastening portions, the assembly portion is a circle, a protrusion, or a strip portion, or two sides thereof corresponding to the fastening portion are protrusions of a cross section.

In the foregoing fastening member with a plurality of fastening portions, one of the fastening portions has a material storage space, and is configured to be pressed by an external force on the fastening member that then presses the first object or the second object such that the material of the first object or the second object enters the material storage space, and to be assembled with the first object or the second object. Alternatively, another fastening portion is configured to be pressed by an external force, to be deformed and engaged with the first object or the second object, and to be assembled with the first object or the second object.

Thus, the fastening member with a plurality of fastening portions of the present invention can be disposed at the third object and be connected to the first object and the second object by the fastening portions, respectively, so as to complete coupling and separation of at least three objects and achieve the object of repeated quick coupling and separation.

DETAILED DESCRIPTION OF THE INVENTION

To fully understand the objects, features and functions of the present invention, details of the present invention are given in specific embodiments with the accompanying drawings below.

Figure 1:
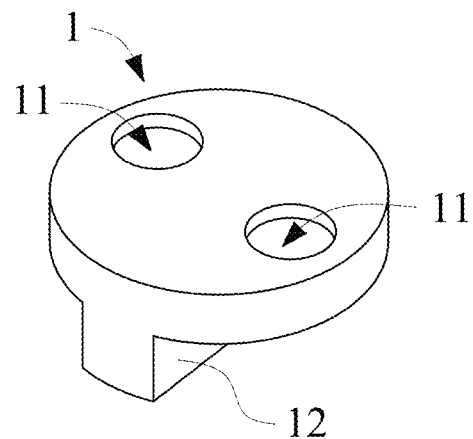
FIG. 1 is a schematic diagram of an appearance according to a first embodiment of the present invention.
Figure 2:
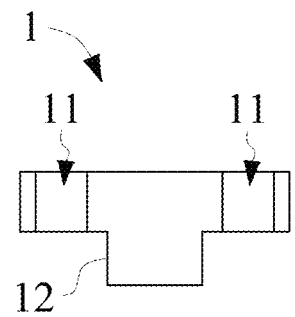
FIG. 2 is a schematic diagram of a state of cross section according to the first embodiment of the present invention.
Figure 3:
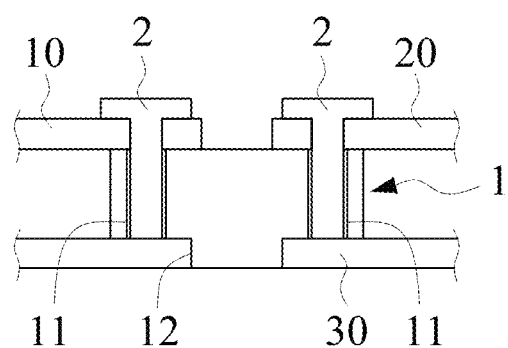
FIG. 3 is a schematic diagram of a state of use according to the first embodiment of the present invention.

Referring to FIG. 1 to FIG. 3, as shown in the drawings, the present invention provides a fastening member with a plurality of fastening portions. The fastening member 1 includes two or more fastening portions 11, which are respectively configured to be connected to a first object 10 or to be connected to a second object 20. The fastening portions 11 have the same (or different) fastening direction(s) and fastening connection position(s).

To put to use, the fastening member 1 may be disposed at a third object 30, and is connected to the first object 10 and the second object 20 by the fastening portions 11, respectively. In this embodiment, the fastening portions 11 are holes, respectively, and are connected to the first object 10 and the second object 20 using collaboration of respective fasteners 2, respectively. To remove the first object 10 and the second object 20, the fasteners 2 are removed from the fastening portions 11. Thus, coupling and separation of the three objects (the first object 10, the second object 20 and the third object 30) may be completed, achieving the object of repeated quickly coupling and separation.

In a preferred specific embodiment of the present invention, the fastening member 1 includes one or more assembly portions 12 configured to be assembled to the third object 30 (or a fourth object, not shown), and the assembly portions 12 of this embodiment are located on positions in the middle of the two fastening portions 11 (or between the two fastening portions 11). Thus, the fastening member 1 may be stably disposed at the third object 30 by the assembly portions 12, so as to securely assemble the first object 10 and the second object 20 to the fastening member 1 by mutual collaboration of the fastening portions 11 and the fasteners 2, enabling the present invention to better meet requirements of actual applications.

In a preferred specific embodiment of the present invention, the assembly portion 12 (or the fastening portions 11) are configured to be assembled to the third object (or a fourth object, not shown) by rivet connection, fastening connection, welding connection, expansion connection, lock connection, sleeve connection, or fastening connection with another fastening member. Thus, the fastening member 1 may be stably disposed at the third object 30, so as to securely assemble the first object 10 and the second object 20 to the fastening member 1 by mutual collaboration of the fastening portions 11 and the fasteners 2, enabling the present invention to better meet requirements of actual applications.

In a preferred specific embodiment of the present invention, the fastening member 1 may be formed by turning, forging, injection molding, stamping, rolling, or in-film injection. Further, the fastening member 1 is in a metal material, a non-metal material or a plastic material, enabling the present invention to better meet requirements of actual applications.

In a preferred specific embodiment of the present invention, the surface of the fastening member 1 may be electroplated zinc, nickel, copper, anode electroplating, gold, silver or tin, so as to serve as surface protection of the fastening member 1, enabling the present invention to better meet requirements of actual application.

In a preferred specific embodiment of the present invention, the assembly portion 12 (or the fastening portions 11) may be a protrusion, a recess, a plane portion, a curved surface portion, an arc surface portion, a stepped surface portion, an inclined surface portion, a circle, or a strip portion, or two sides thereof corresponding to the fastening portion are protrusions of a cross section, enabling the present invention to better meet requirements of actual applications.

In a preferred specific embodiment of the present invention, the fastening portions 11 are respectively located on the same horizontal positions, such that the fastening connection directions of the fastening portions 11 are on the same horizontal position in the same horizontal direction, and the first object 10 and the second object 20 assembled to the fastening member 1 are on the same horizontal position in the same horizontal direction, enabling the present invention to better meet requirements of actual applications.

In a preferred specific embodiment of the present invention, each of the fastening portions 11 may be a thread portion, an outer thread portion, an inner thread portion, a slot, a recess, a hole, a protrusion, a column, a fastener, a I-shaped body, a plate body or a hook body, enabling the present invention to better meet requirements of actual applications.

In a preferred specific embodiment of the present invention, the assembly portion 12 may be on a middle position, an upper position, a lower position, positions on two sides, a vertical position or a horizontal position of the two fastening portions 11, enabling the present invention to better meet requirements of actual applications.

In a preferred specific embodiment of the present invention, the first object 10 and the second object 20 may be connected in a manner of the same height, the same vertical direction or the same horizontal direction using the fasteners 2. Further, the first object 10 and the second object 20 may also be connected (not shown) in a manner of different heights, different vertical directions or different horizontal directions using the fasteners 2, enabling the present invention to better meet requirements of actual applications.

In a preferred specific embodiment of the present invention, the first object 10, the second object 20 and the third object 30 (or a fourth object, not shown) may be fixed, rotated, turned, floatingly displaced, vertically floatingly displaced, horizontally floatingly displaced, height floatingly displaced or limited fixing connected using the fastener 2 as a fulcrum, enabling the present invention to better meet requirements of actual applications.

Figure 4:
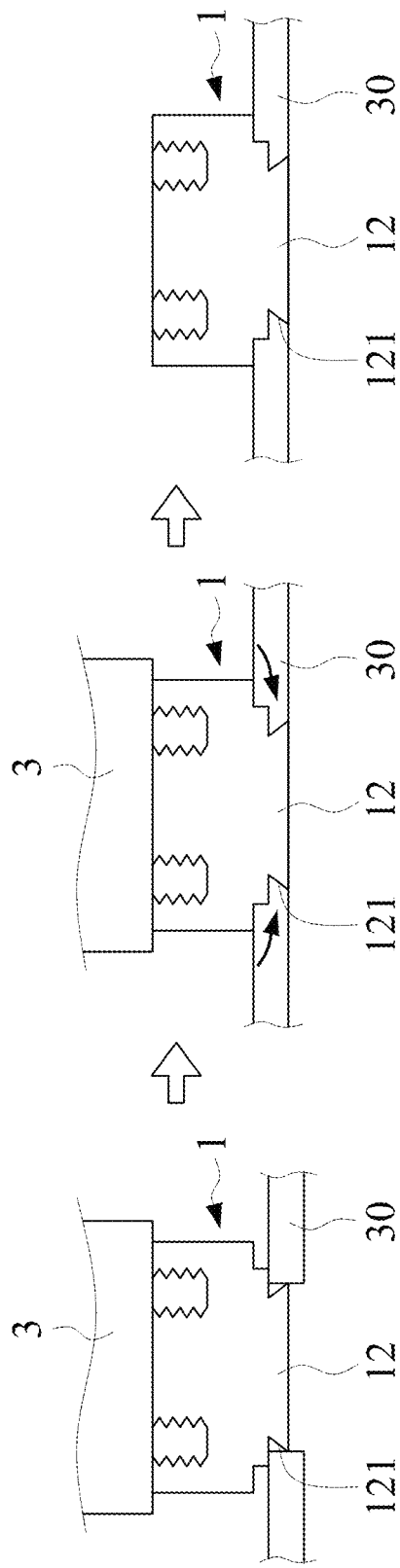
FIG. 4 is a schematic diagram of a state of assembly according to a second embodiment of the present invention.

Referring to FIG. 4, as shown, in a preferred specific embodiment of the present invention, the assembly portion 12 has a material storage space 121, and is configured to be pressed by an external force by a tool 3 on the fastening member 1 that then presses the third object 30 (or a fourth object, not shown) such that the material of the third object 30 (or the fourth object) enters the material storage space 121 of the assembly portion 12, and to be assembled with the third object 30. Thus, the fastening member 1 may be stably disposed at the third object 30 for requirements of subsequent use.

Figure 5:
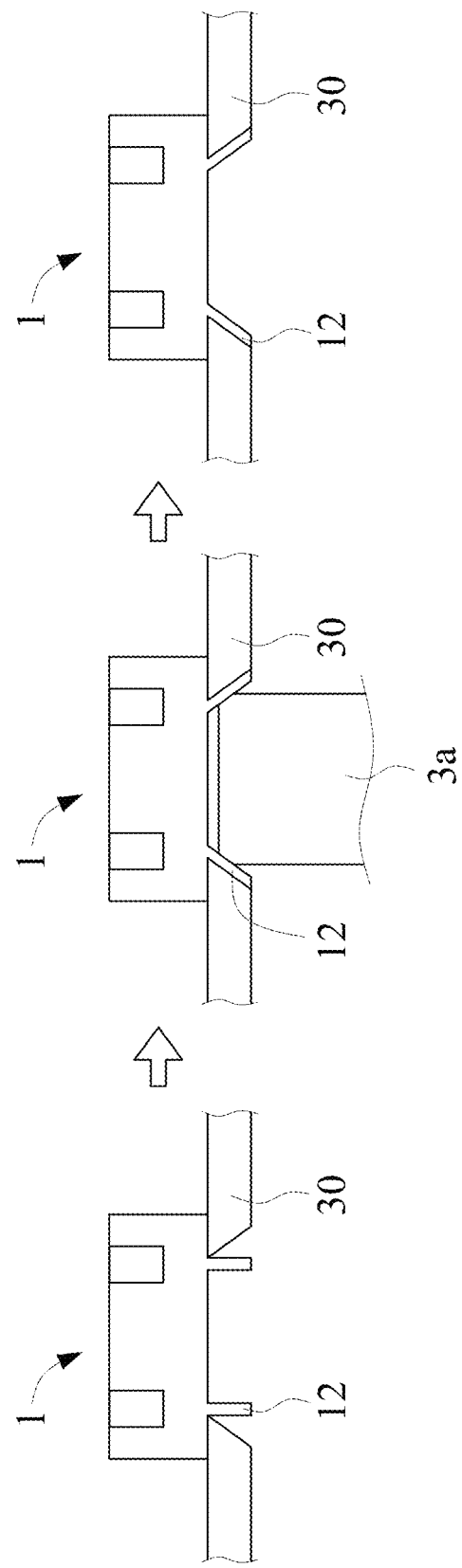
FIG. 5 is a schematic diagram of a state of assembly according to a third embodiment of the present invention.

Referring to FIG. 5, as shown, in a preferred specific embodiment of the present invention, the assembly portion 12 (or the fastening portions) is configured to be pressed by an external force by a tool 3a, be deformed and engaged with the third object 30 (or the fourth object, not shown), and to be assembled with the third object. Thus, the fastening member 1 may be stably disposed at the third object 30 for requirements of subsequent use.

Figure 6:
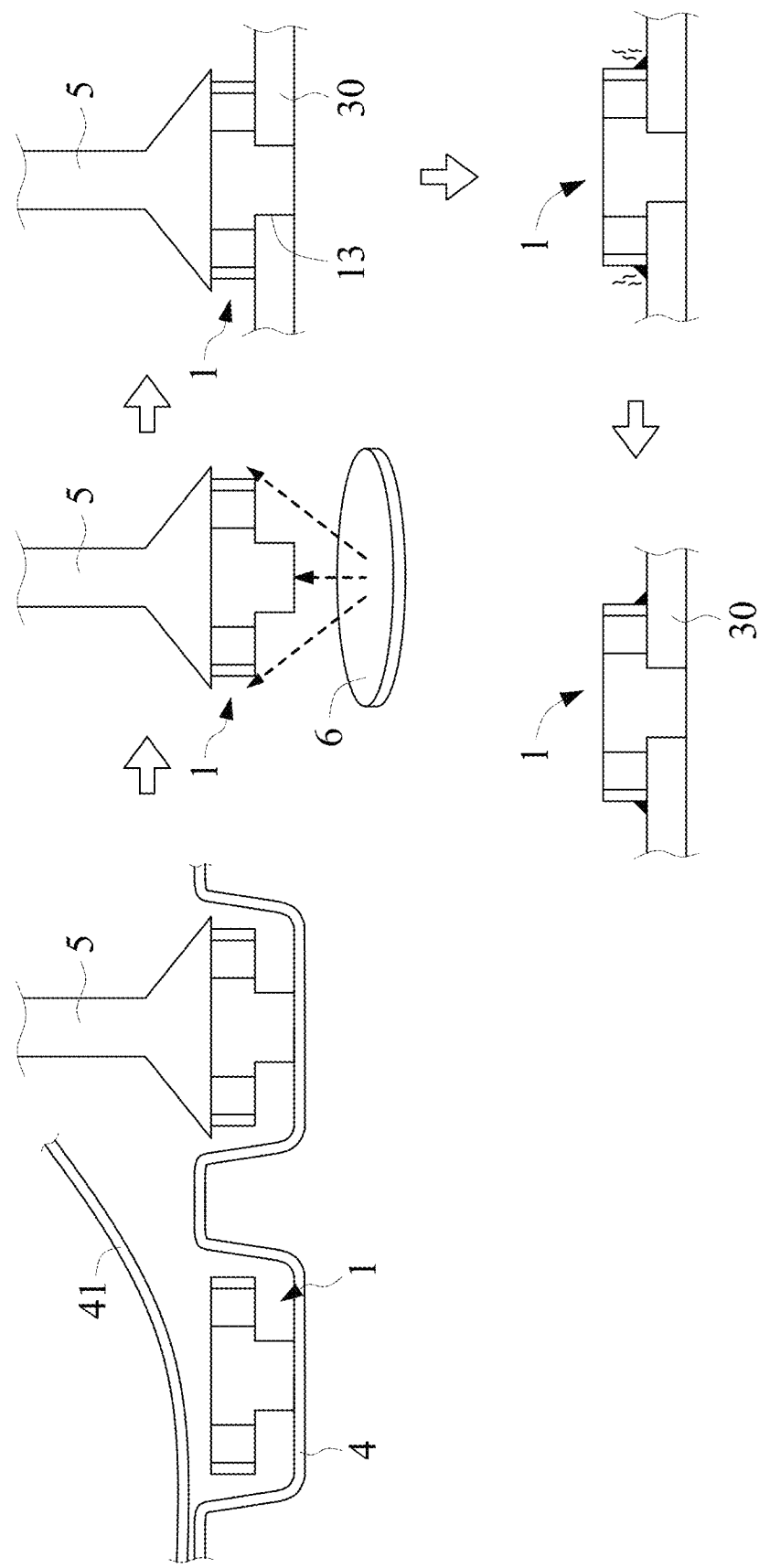
FIG. 6 is a schematic diagram of a state of assembly according to a fourth embodiment of the present invention.

Referring to FIG. 6, as shown, in a preferred specific embodiment of the present invention, the fastening member 1 may be placed in a carrier 4. The fastening member 1 is configured to be taken out from the carrier 4 by a tool 5, and be compared with the position of the third object 30 (or the first object, the second object, or the fourth object, not shown) by a comparison device 6 and placed for assembly or fastening connection. Thus, the fastening member 1 may be stably disposed at the third object 30 for requirements of subsequent use.

In a preferred specific embodiment of the present invention, the fastening member 1 has a welding surface 13 configured to be weld connected to the third object 30 (or the first object, the second object or the fourth object, not shown).

In a preferred specific embodiment of the present invention, the third object 30 (or the first object, the second object or the fourth object, not shown) is a printed circuit board (PCB), enabling the present invention to better meet requirements of actual applications.

In a preferred specific embodiment of the present invention, in addition to the welding surface 13 included by the fastening member 1, the third object 30 (or the first object, the second object or the fourth object, not shown) may further have a welding surface (not shown). The material of the welding surface 13 may be tin, copper, nickel, zinc or a related weldable material, enabling the present invention to better meet requirements of actual applications.

In a preferred specific embodiment of the present invention, the carrier 4 may include a cover 41. Thus, the fastening member 1 may be stably disposed in the carrier 4.

Figure 7:
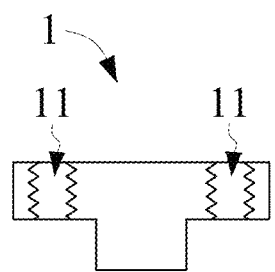
FIG. 7 is a schematic diagram of a structure according to a fifth embodiment of the present invention.

Referring to FIG. 7, as shown, in a preferred specific embodiment of the present invention, each of the fastening portions 11 of the fastening member 1 may be a thread portion (an inner thread portion), enabling the present invention to better meet requirements of actual applications.

Figure 8:
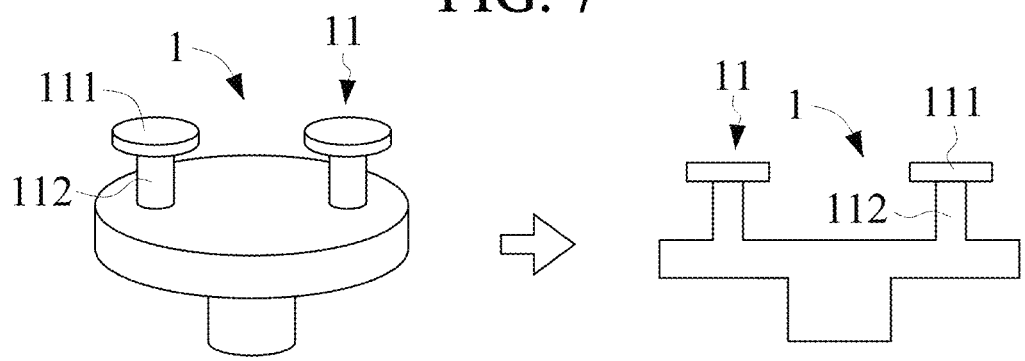
FIG. 8 is a schematic diagram of a structure according to a sixth embodiment of the present invention.

Referring to FIG. 8, as shown, in a preferred specific embodiment of the present invention, each of the fastening portions 11 of the fastening member 1 includes a head 111 and a neck 112, enabling the present invention to better meet requirements of actual applications.

Figure 9:
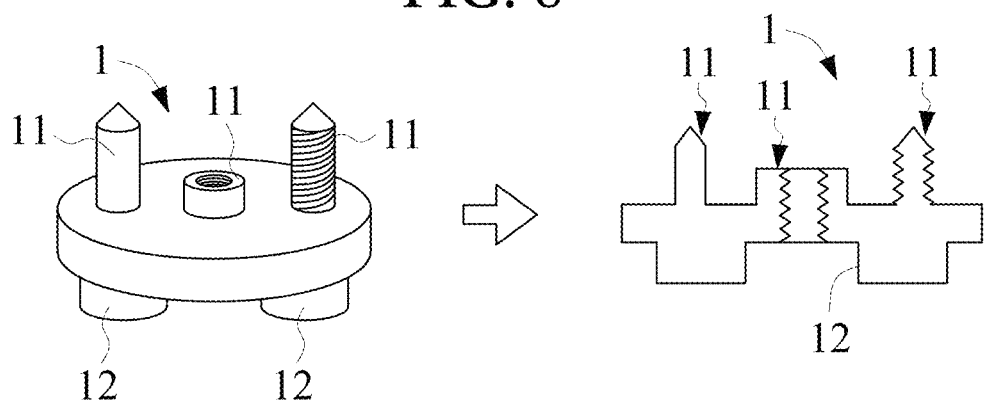
FIG. 9 is a schematic diagram of a structure according to a seventh embodiment of the present invention.

Referring to FIG. 9, as shown, in a preferred specific embodiment of the present invention, each of the fastening portions 11 of the fastening member 1 may be a combination of an outer thread portion, an inner thread portion and a column. The fastening connection directions of the fastening portions 11 are on the same horizontal position in the same vertical direction, and the assembly portions 12 are located on positions on two sides, enabling the present invention to better meet requirements of actual applications.

Figure 10:
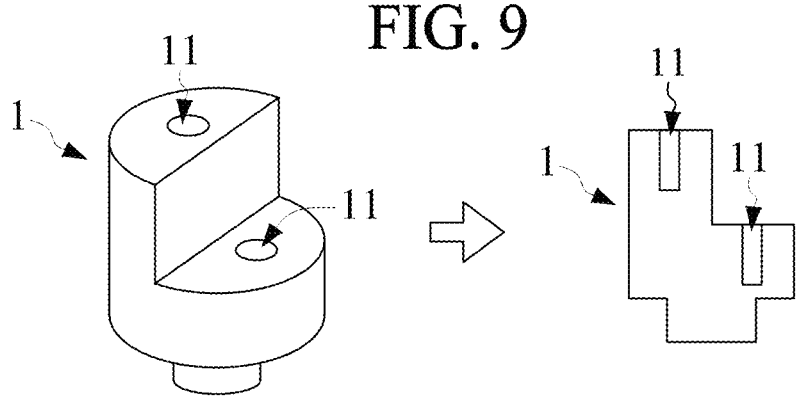
FIG. 10 is a schematic diagram of a structure according to an eighth embodiment of the present invention.
Figure 11:
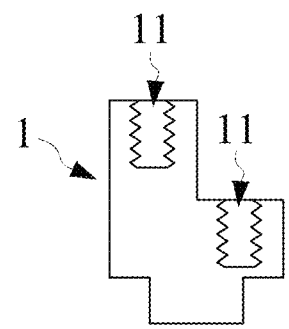
FIG. 11 is a schematic diagram of a structure according to a ninth embodiment of the present invention.

Referring to FIG. 10 and FIG. 11, as shown, in a preferred specific embodiment of the present invention, the fastening portions 11 of the fastening member 1 may respectively be a slot and a thread portion (an inner thread portion), the fastening connection directions of the fastening portions 11 are on different horizontal positions in the same horizontal direction, and the fastening portions 11 are respectively on positions of different vertical heights, enabling the present invention to better meet requirements of actual applications.

Figure 12:
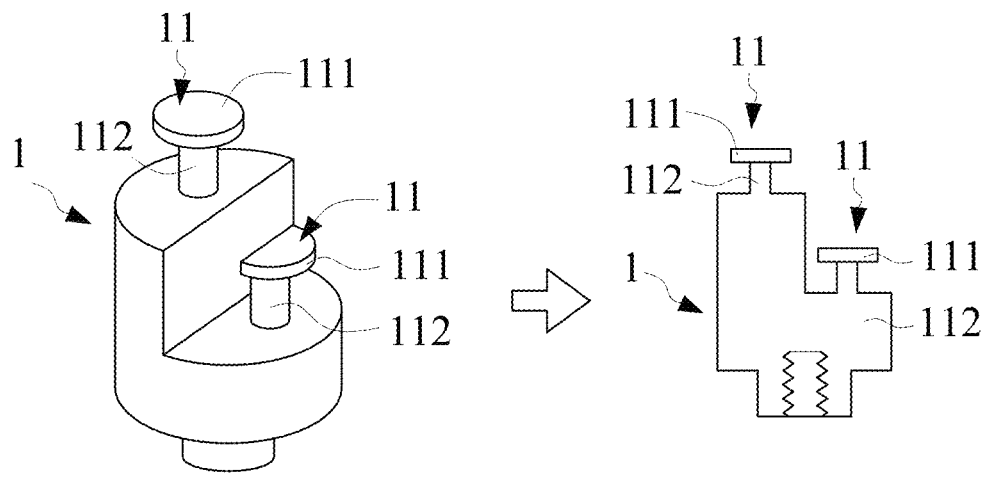
FIG. 12 is a schematic diagram of a structure according to a tenth embodiment of the present invention.

Referring to FIG. 12, as shown, in a preferred specific embodiment of the present invention, each of the fastening portions 11 of the fastening member 1 includes a head 111 and a neck 112, the fastening connection directions of the fastening portions 11 are respectively on different horizontal positions in the same horizontal direction, and the fastening portions 11 are on position of different vertical heights, enabling the present invention to better meet requirements of actual applications.

Figure 13:
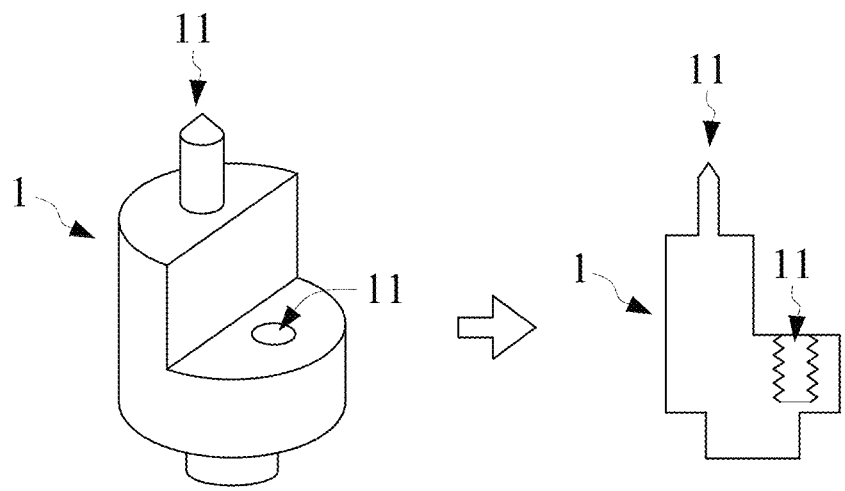
FIG. 13 is a schematic diagram of a structure according to an eleventh embodiment of the present invention.

Referring to FIG. 13, as shown, in a preferred specific embodiment of the present invention, the fastening portions 11 of the fastening member 1 may respectively be a column and a thread portion (an inner thread portion), the fastening connection directions of the fastening portions 11 are respectively on different horizontal positions in the same horizontal direction, and the fastening portions 11 are respectively on positions of different vertical heights, enabling the present invention to better meet requirements of actual applications.

Figure 14:
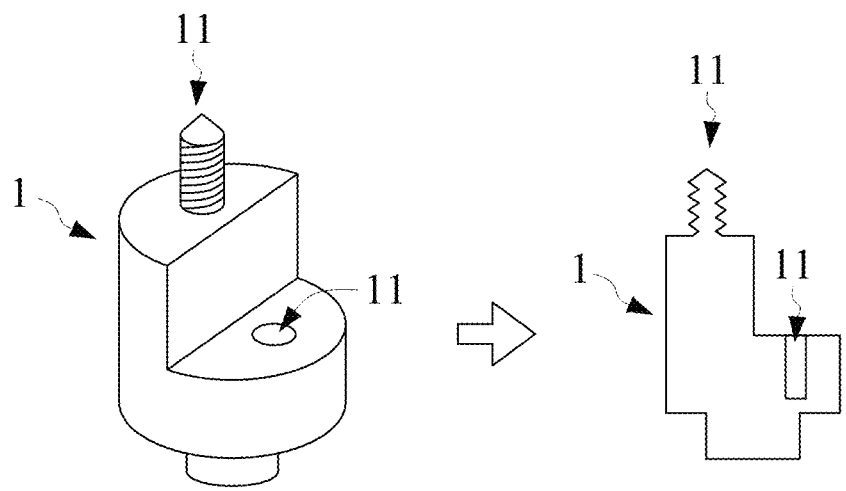
FIG. 14 is a schematic diagram of a structure according to a twelfth embodiment of the present invention.

Referring to FIG. 14, as shown, in a preferred specific embodiment of the present invention, the fastening portions 11 of the fastening member 1 may respectively be an outer thread portion and a slot, the fastening connection directions of the fastening portions 11 are respectively on different horizontal positions in the same horizontal direction, and the fastening portions 11 are respectively on positions of different vertical heights, enabling the present invention to better meet requirements of actual applications.

Figure 15:
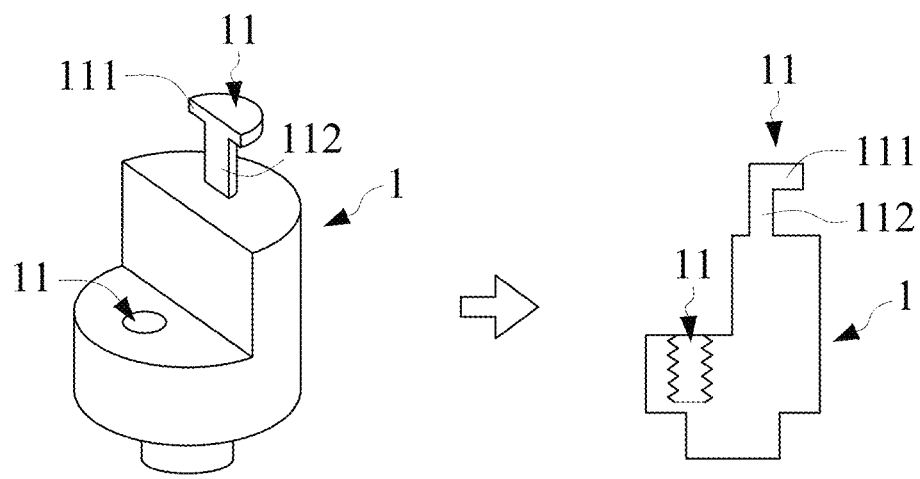
FIG. 15 is a schematic diagram of a structure according to a thirteenth embodiment of the present invention.

Referring to FIG. 15, as shown, in a preferred specific embodiment of the present invention, one of the fastening portions 11 of the fastening member 1 may include a head 111 and a neck 112, and the other fastening portion 11 is a thread portion (an inner thread portion), the fastening connection directions of the fastening portions 11 are respectively on different horizontal positions in the same horizontal direction, and the fastening portions 11 are respectively on positions of different vertical heights, enabling the present invention to better meet requirements of actual applications.

Figure 16:
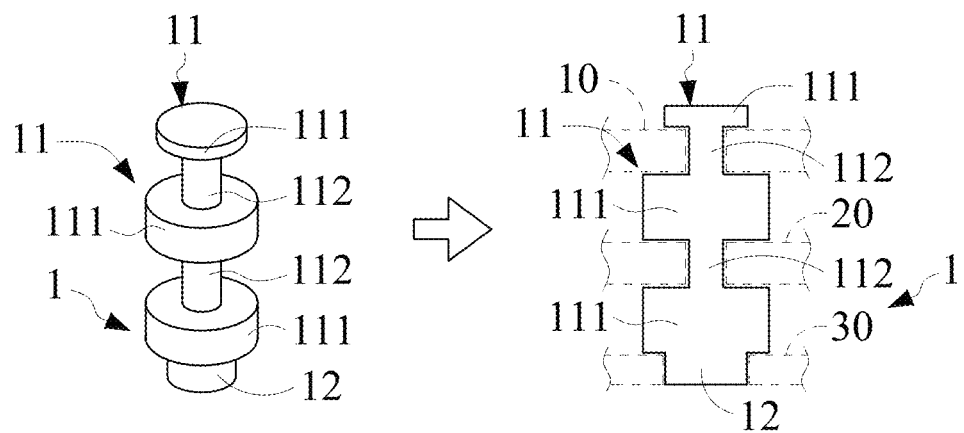
FIG. 16 is a schematic diagram of a structure according to a fourteenth embodiment of the present invention.

Referring to FIG. 16, as shown, in a preferred specific embodiment of the present invention, the fastening member 1 with a plurality of fastening portions 11 includes one assembly portion 12 the assembly portion 12 is located at one end of the fastening member 1, the fastening portions 11 being configured to be connected to a first object 10 and a second object 20. The fastening portions 11 of the fastening member 1 includes three heads 111 and two necks 112, the three heads 111 and the two necks 112 are connected in series in a way of one said neck 112 between two said heads 111. The fastening portions 11 are respectively on the same vertical position, and the fastening connection directions of the fastening portions 11 are respectively on different horizontal positions in the same vertical direction and positions of different vertical heights, enabling the present invention to better meet requirements of actual applications. The assembly portion 12 is configured to be connected to a third object 30, and the first object 10 and the second object 20 are located at each position of the necks 112 and blocked by the heads 111, so as the first object 10, the second object 20, and the third object 30 are fastened to each other.

Figure 17:
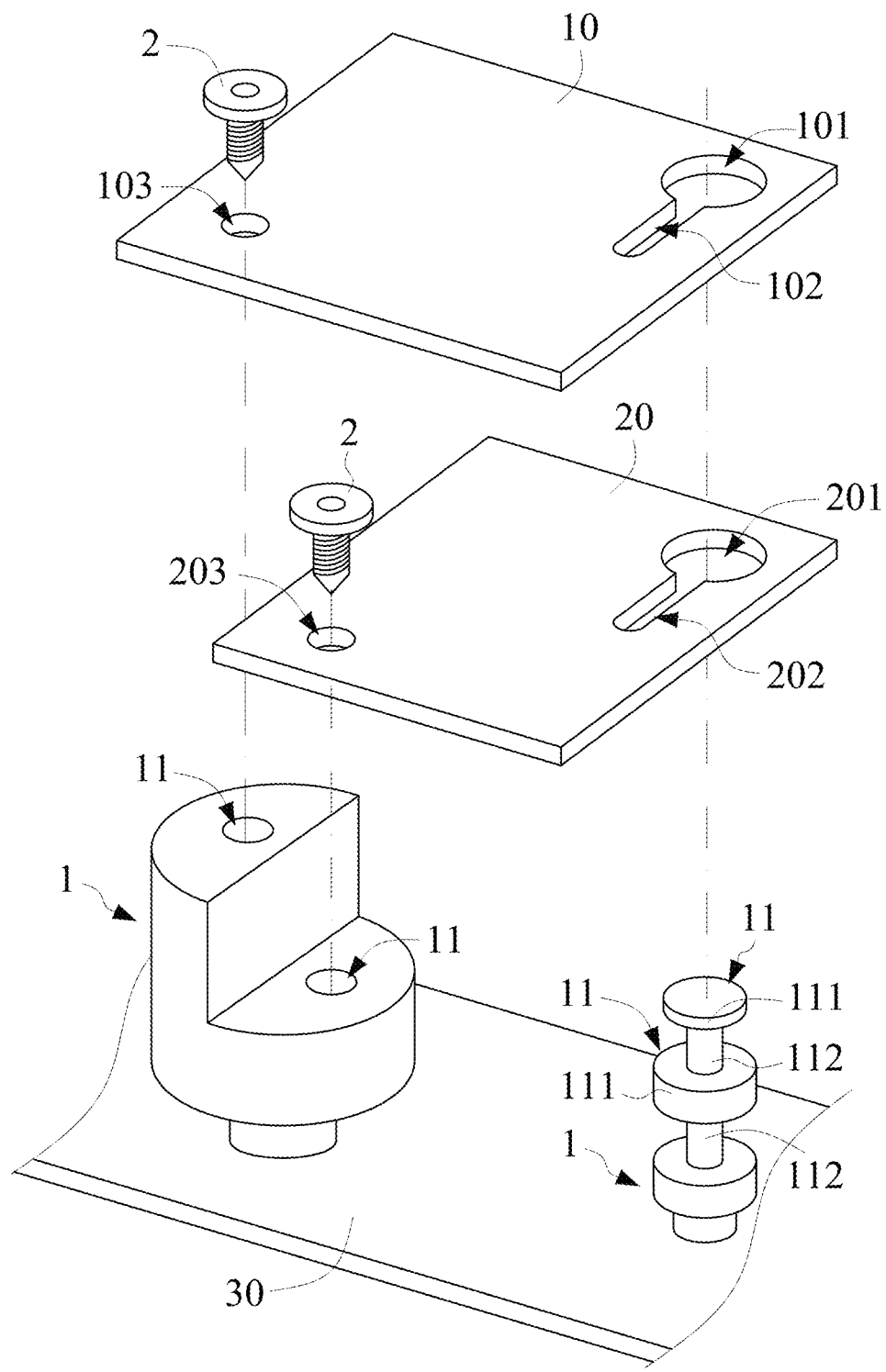
FIG. 17 is a schematic diagram of a state of use according to a fifteenth embodiment of the present invention.
Figure 18:
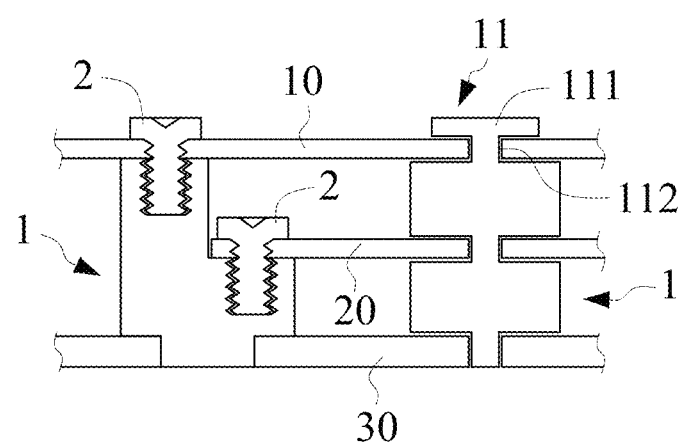
FIG. 18 is a schematic diagram of a state of use according to a sixteenth embodiment of the present invention.

Referring to FIG. 17 and FIG. 18, as shown, in a preferred specific embodiment of the present invention, to put to use, the fastening members 1 of two different forms may be used. Each of the fastening portions 11 of one of the fastening members 1 includes a head 111 and a neck 112, and the fastening connection directions of the fastening portions 11 are respectively on different horizontal positions in the same vertical direction and positions of different vertical heights. The fastening portions 11 of the other fastening member 11 may respectively a slot and a thread portion (an inner thread portion), and the fastening connection directions of the fastening portions 11 are on different horizontal positions in the same horizontal direction, and the fastening portions 11 are respectively on positions of different vertical heights.

For assembly, the fastening members 1 may be disposed at a third object 30, and the first object 10 and the second object 20 are first coupled with one fastening member 1. For coupling, the head 11 first enters receiving fastening portions 101 and 201 of the first object 10 and the second object 20, the neck 112 is receivingly fastening into fastening connection portions 102 and 202 of the first object 10 and the second object 20, through holes 103 and 203 on the first object 10 and the second object 20 are respectively corresponded with the fastening portions 11 of the another fastening member 1, and the fastening portions 11 are connected to the first object 10 and the second object 20 by the fasteners 2, respectively. To remove the first object 10 and the second object 20, the fasteners 2 are removed from the fastening portions 11, and the fastening connection portions 102 and 202 of the first object 10 and the second object 20 are then moved to the receiving fastening portions 101 and 201 from the neck 112, so as to disengage the receiving fastening portions 101 and 201 from the head 111 and to remove the first object 10 and the second object 20. Thus, coupling and separation of three objects (coupling of the first object 10, the second object 20 and the third object 30) may be completed, achieving the object of repeated quick coupling and separation.

In a preferred specific embodiment of the present invention, the widths of the receiving fastening portions 101 and 201 are more than that of the head 111, and the widths of the fastening connection portions 102 and 202 are less than that of the head 111 but more than that of the neck 112. Thus, the head 111 may first enter the receiving fastening portions 101 and 201 of the first object 10 and the second object 20, and the neck 112 may then be receivingly fastened in the fastening connection portions 102 and 202 of the first object 10 and the second object 20, so as to implement stable assembly.

In a preferred specific embodiment of the present invention, the first object 10, the second object 20 and the third object 30 (or a fourth object) may be connected in a manner of different heights, different vertical directions and different horizontal directions using the fasteners 2. Further, the first object 10, the second object 20 and the third object 30 (or a fourth object) may be connected in a manner of the same height, the same vertical direction and the same horizontal direction using the fasteners 2, enabling the present invention to better meet requirements of actual applications.

Figure 19:
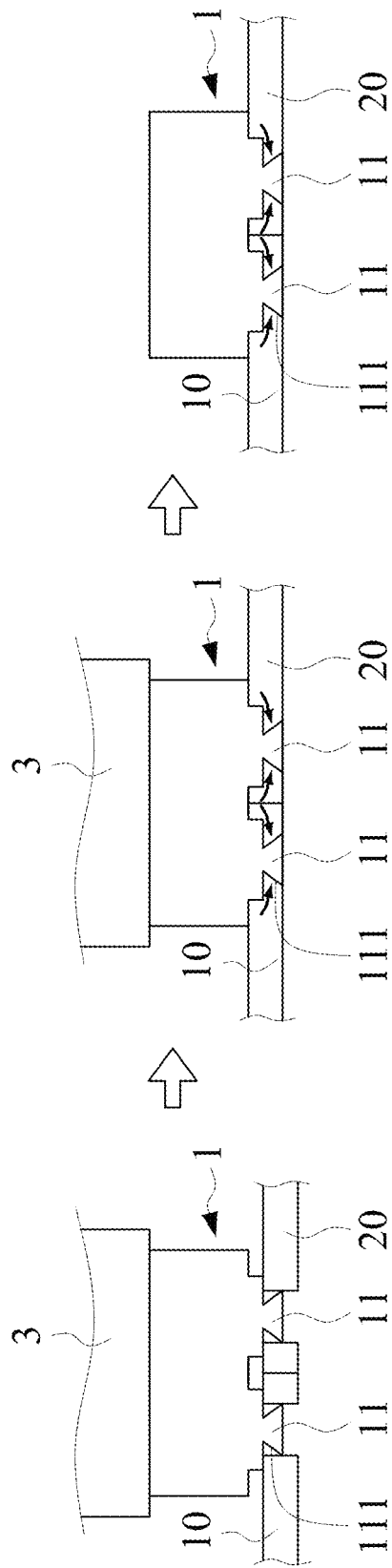
FIG. 19 is a schematic diagram of a state of assembly according to a seventeenth embodiment of the present invention.

Referring to FIG. 19, as shown, in a preferred specific embodiment of the present invention, the fastening portions 11 of the fastening member 1 are respectively on the same horizontal position. Each of the fastening portions 11 (or one of the fastening portions 11) has a material storage space 113, and is configured to be pressed by an external force by a tool 3 on the fastening member 1 that then presses the first object 10 and the second object 20 such that the materials of the first object 10 and the second object 20 enter the material storage space 113, and to be assembled with the first object 10 and the second object 20, enabling the present invention to better meet requirements of actual applications. Alternatively, only one of the fastening portions 11 is provided with the material storage space 113 (not shown), and is configured to be pressed by an external force on the fastening member 1 that then presses the first object 10 or the second object 20 such that the material of the first object 10 or the second object 20 enters the material storage space 113, and to be assembled with the first object 10 or the second object 20.

Figure 20:
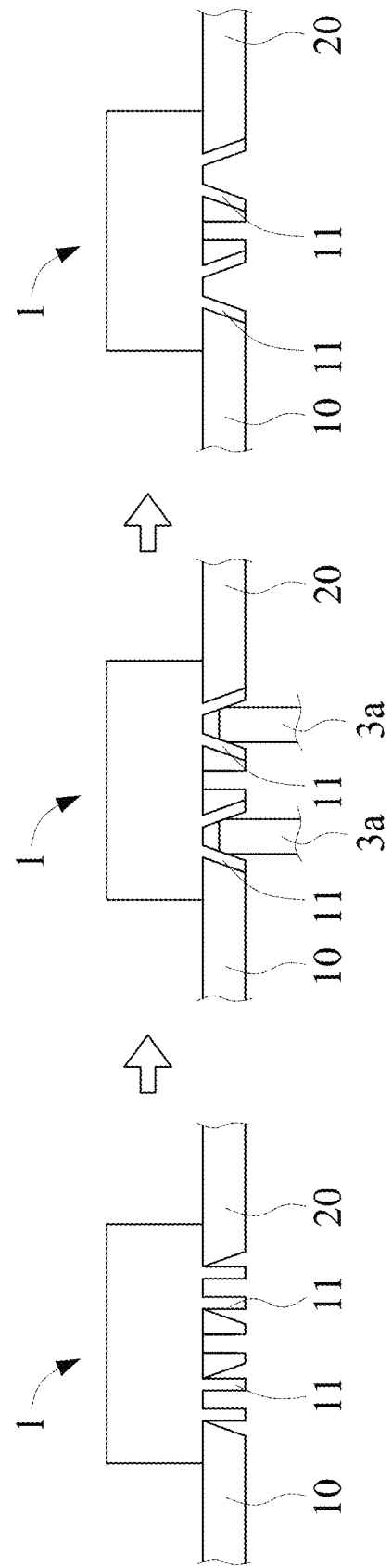
FIG. 20 is a schematic diagram of a state of assembly according to an eighteenth embodiment of the present invention.

Referring to FIG. 20, as shown, in a preferred specific embodiment of the present invention, the fastening portions 11 (or one of the fastening portions 11) is configured to be pressed by an external force by a tool 3a, to be deformed and engaged with the first object 10 and the second object, and to be assembled with the first object 10 and the second object 20, enabling the present invention to better meet requirements of actual applications.

Figure 21:
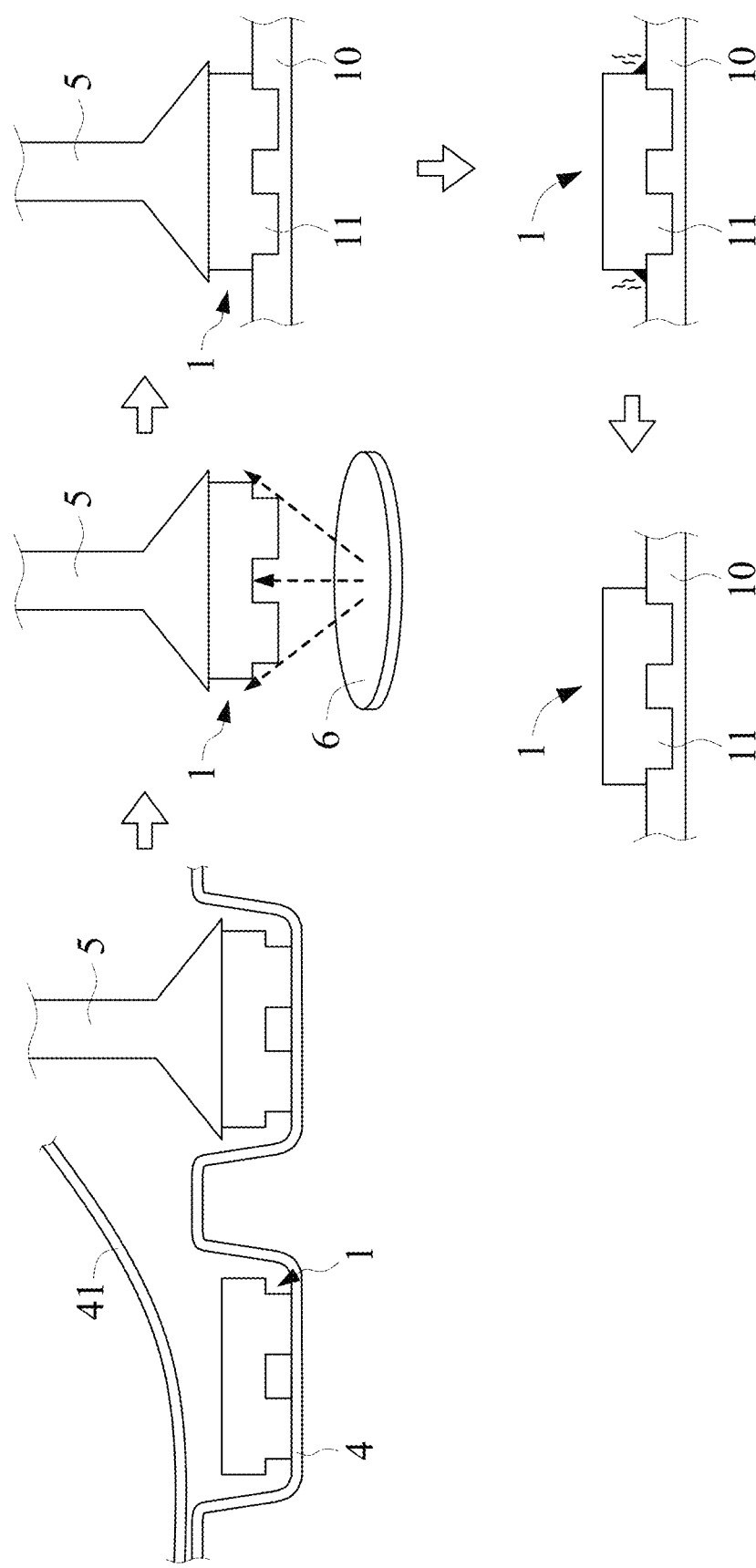
FIG. 21 is a schematic diagram of a state of assembly according to a nineteenth embodiment of the present invention.

Referring to FIG. 21, as shown, in a preferred specific embodiment of the present invention, the fastening member 1 may be placed in a carrier 4. The fastening member 1 is taken out from the carrier 4 by a tool 5, is compared with the position of the first object 10 by a comparison device 6, and is welded using the fastening portions 11. Thus, the fastening member 1 may be stably disposed at the first object 10.

Figure 22:
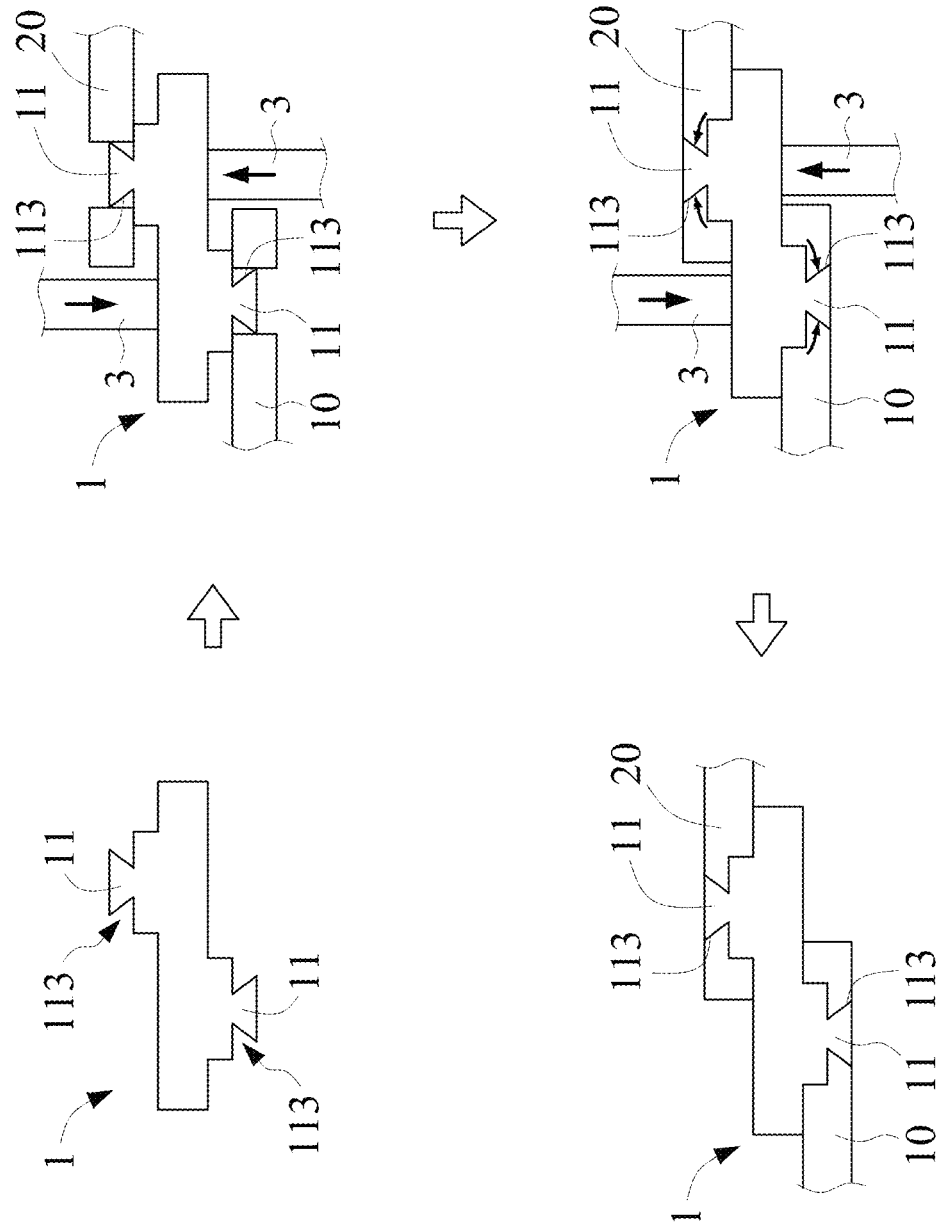
FIG. 22 is a schematic diagram of a state of assembly according to a twentieth embodiment of the present invention.

Referring to FIG. 22, as shown, in a preferred specific embodiment of the present invention, the fastening portions 11 of the fastening member 1 are respectively on different horizontal positions and different vertical positions, and the fastening connection directions of the fastening portions 11 are respectively on opposite horizontal positions and vertical positions. Further, each of the fastening portions 11 has a material storage space 113, and is configured to be pressed by an external force by a tool 3 on the fastening member 1 that then presses the first object 10 and the second object 20 such that the materials of the first object 10 and the second object 20 enter the material storage space 113, and to be assembled with the first object 10 and the second object 20. Thus, the first object 10 and the second object 20 may be connected in a manner of different heights, different vertical directions and different horizontal directions using the fasteners 2, enabling the present invention to better meet requirements of actual applications.

Figure 23:
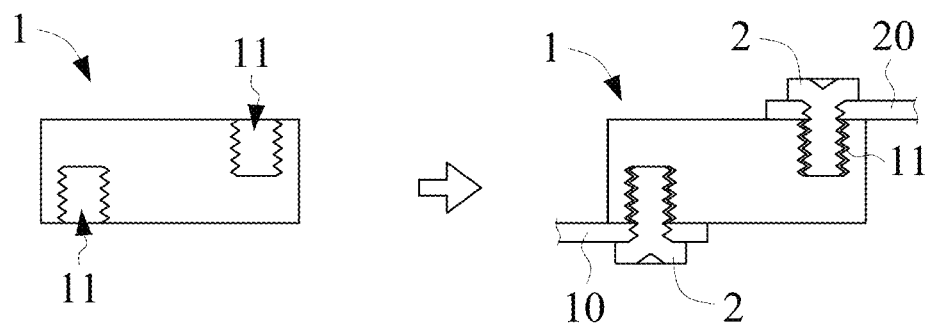
FIG. 23 is a schematic diagram of a state of assembly according to a twenty-first embodiment of the present invention.

Referring to FIG. 23, as shown, in a preferred specific embodiment of the present invention, the fastening portions 11 of the fastening member 1 are respectively on positions of different vertical heights and different horizontal directions, the fastening portions 11 are respectively thread portions (inner thread portions), the fastening connection directions of the fastening portions 11 of the fastening member 1 are respectively on opposite vertical positions, and the fastening portions 11 are respectively connected to the first object 10 and the second object 20 by fasteners 2, such that the first object 10 and the second object 20 may be connected in a manner of different heights, different vertical directions and different horizontal directions using the fasteners 2, enabling the present invention to better meet requirements of actual applications.

Figure 24:
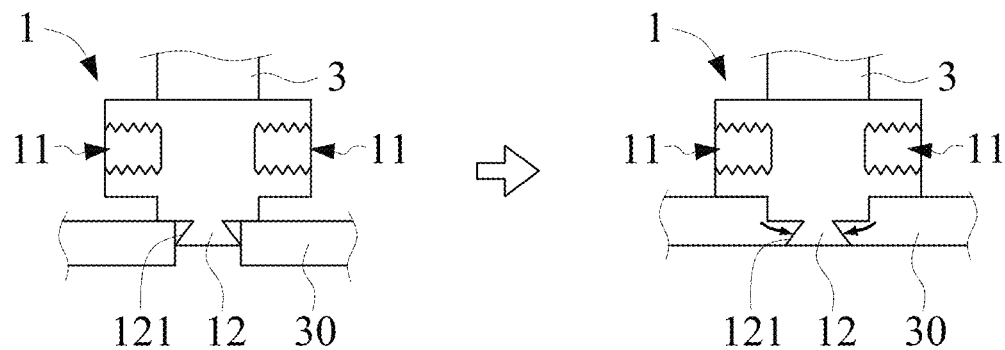
FIG. 24 is a schematic diagram of a state of assembly according to a twenty-second embodiment of the present invention.

Referring to FIG. 24, as shown, in a preferred specific embodiment of the present invention, the fastening connection directions of the fastening portions 11 of the fastening member 1 are respectively on opposite horizontal positions. The assembly portion 12 (or the fastening portions 11) has a material storage space 121, and is configured to be pressed by an external force by a tool 3 on the fastening member 1 that then presses the third object 30 such that the material of the third object 30 (or a fourth object, not shown) enters the material storage space 121 of the assembly portion 12, and to be assembled with the third object 30. Thus, the fastening member 1 may be stably disposed at the third object 30 for requirements of subsequent use.

Figure 25:
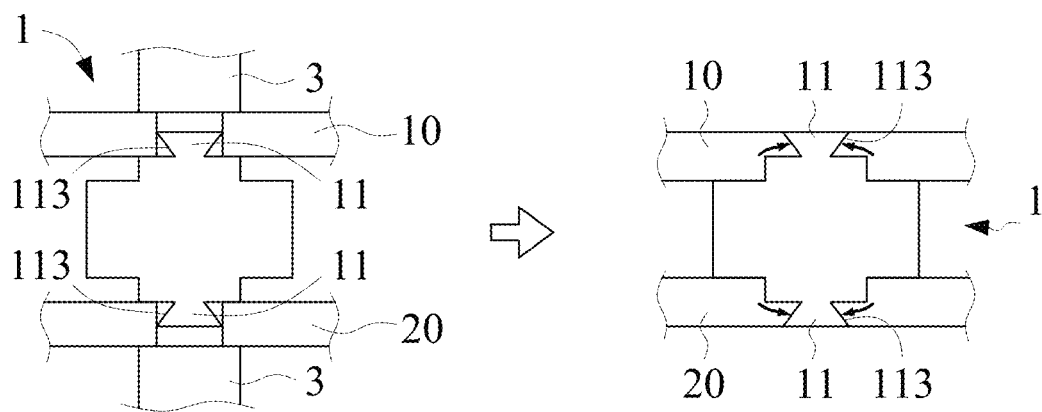
FIG. 25 is a schematic diagram of a state of assembly according to a twenty-third embodiment of the present invention.

Referring to FIG. 25 as shown, in a preferred specific embodiment of the present invention, the fastening connection directions of the fastening portions 11 of the fastening member 1 are respectively on opposite vertical positions, and the fastening connection directions of the fastening portions 11 are respectively on opposite horizontal positions and vertical positions. Further, each of the fastening portions 11 has a material storage space 113, and is configured to be pressed by an external force by a tool 3 on the first object 10 and the second object 20 such that the materials of the first object 10 and the second object 20 respectively enter the material storage space 113, and to be assembled with the first object 10 and the second object 20. Thus, the first object 10 and the second object 20 may be connected in a manner of different heights and different horizontal directions using the fasteners 2, enabling the present invention to better meet requirements of actual applications.

While the invention has been described by way of example and in terms of the embodiments, a person skilled in the art should understood that the embodiments are for illustrating the present invention and are not to be construed as limitations to the scope of the present invention. It should be noted that, equivalent modifications and substitutions made to the embodiments are to be encompassed within the scope of the present invention. Therefore, the protection scope of the present invention is to be accorded with the appended claims.

What is claimed is:

1. A fastening member with a plurality of fastening portions and an assembly portion, and the fastening member including a first object, a second object, and a third object, the assembly portion is located at one end of the fastening member, the fastening portions being configured to be connected to the first object or the second object;

wherein the fastening portions are integrally formed and comprise a plurality of heads and a plurality of necks, the heads are one more than the necks, and the heads and the necks are connected in series in a way of one said neck between two said heads, the heads and the necks of the fastening portions are fixed in shape rather than deformed by external force, the fastening portions are respectively on same vertical positions, and the fastening connection directions of the fastening portions are respectively on different horizontal positions and different vertical heights in a same vertical direction;

wherein the assembly portion is configured to be connected to the third object, and the first object and the second object are located at each position of the necks and blocked by the heads, so as the first object, the second object, and the third object are fastened to each other;

wherein the first object and the second object each have a receiving fastening portion and a fastening connection portion are connected to each other, each head enters the receiving fastening portions of the first object and the second object by one after another, and then slides each neck into the fastening connection portions of the first object and the second object, so as each neck is receivingly fastened in the fastening connection portions of the first object and the second object.

* * * * *